United States Patent [19]

Hsia et al.

[11] Patent Number: 4,861,730

[45] Date of Patent: Aug. 29, 1989

[54] PROCESS FOR MAKING A HIGH DENSITY SPLIT GATE NONVOLATILE MEMORY CELL

[75] Inventors: Steve K. Hsia, Saratoga; Pritpal S. Mahal; Wei-Ren Shih, both of San Jose, all of Calif.

[73] Assignee: Catalyst Semiconductor, Inc., Santa Clara, Calif.

[21] Appl. No.: 147,843

[22] Filed: Jan. 25, 1988

[51] Int. Cl.[4] ............... H01L 27/10; H01L 29/78
[52] U.S. Cl. ..................... 437/43; 148/DIG. 82; 148/DIG. 102; 437/27; 437/150; 437/924; 437/984; 357/23.5; 357/91; 357/23.9
[58] Field of Search .............. 437/43, 51, 52, 27, 437/28, 29, 150, 153, 154, 924, 984; 148/DIG. 82, DIG. 102; 357/23.5, 23.9, 91

[56] References Cited

U.S. PATENT DOCUMENTS

| | | | |
|---|---|---|---|
| 4,122,544 | 10/1978 | McElroy | 365/185 |
| 4,193,080 | 3/1980 | Koike et al. | 357/23.5 |
| 4,258,378 | 3/1981 | Wall | 357/41 |
| 4,302,766 | 11/1981 | Guterman et al. | 437/43 |
| 4,355,375 | 10/1982 | Arakawa | 365/185 |
| 4,368,524 | 1/1983 | Nakamura et al. | 365/185 |
| 4,376,947 | 3/1983 | Chiu et al. | 365/185 |
| 4,385,308 | 5/1983 | Uchida | 357/23.5 |
| 4,462,090 | 7/1984 | Iizuka | 365/185 |
| 4,620,361 | 11/1986 | Matsukawa et al. | 437/43 |
| 4,639,893 | 1/1987 | Eitan | 365/185 |
| 4,665,418 | 5/1987 | Mizutani | 357/23.5 |
| 4,698,787 | 10/1987 | Mukherjee et al. | 365/185 |

FOREIGN PATENT DOCUMENTS

| | | |
|---|---|---|
| 0047153 | of 1982 | European Pat. Off. . |
| 0148341 | of 1979 | Japan ........ 357/23 |
| 0076877 | of 1982 | Japan ........ 437/43 |
| 0091561 | of 1982 | Japan ........ 357/23.5 |
| 0102073 | of 1982 | Japan ........ 357/23.5 |
| 0186344 | of 1983 | Japan ........ 357/23.5 |
| 0209164 | of 1983 | Japan ........ 437/43 |
| 0206165 | 1/1983 | Japan . |
| 0130475 | of 1984 | Japan ........ 437/43 |

OTHER PUBLICATIONS

Gheorghe Samachisa et al., "A 128 Flash EEPROM Using Double-Polysilicon Technology", from IEEE Journal of Solid State Circuits, vol. SC-22, No. 5, Oct. 1987, pp. 676–683.

Abstract of above-identified Samachisa et al. article from 1987 IEEE Solid-State Circuits Conference Digest of Technical Papers, Feb. 25, 1987, pp. 76 and 77.

Primary Examiner—Brian E. Hearn
Assistant Examiner—Beverly A. Pawlikowski
Attorney, Agent, or Firm—Skjerven, Morrill, MacPherson, Franklin & Friel

[57] ABSTRACT

A process is disclosed for producing a high density split gate nonvolatile memory cell which includes a floating gate and a control gate that is formed above the floating gate. The drain region is self-aligned to the floating gate and the source region is self-aligned to the control gate. Fully self-aligned implantation is made possible by the process and structure using self-aligned etch. Programming of the memory cell uses standard EPROM programming, and erasing is accomplished by Fowler-Nordheim tunneling or photoemission. The memory cell can be made with a reduced cell size and read current uniformity is obtained.

3 Claims, 3 Drawing Sheets

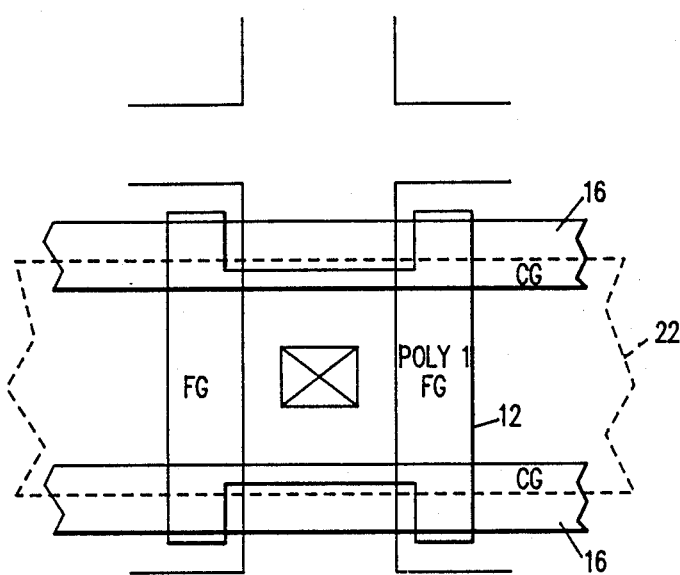
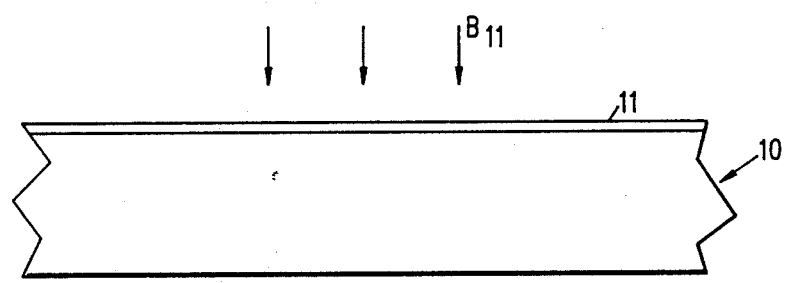
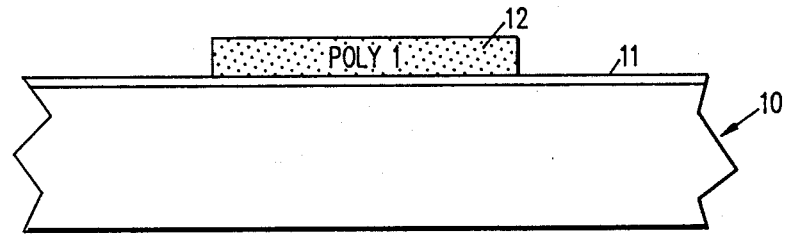

PROCESS FOR MAKING A HIGH DENSITY SPLIT GATE NONVOLATILE MEMORY CELL

FIELD OF THE INVENTION

This invention relates to a high density nonvolatile memory cell and in particular to a process for making a fully self-aligned split gate EPROM or EEPROM.

BACKGROUND OF THE INVENTION

In semiconductor memory devices which are nonvolatile, information that is stored is not lost when the power supply is removed. Memory devices of this type include the EPROM (erasable programmable read only memory) and the EEPROM (electrically erasable programmable read only memory) One type of EPROM is a single transistor cell incorporating two polysilicon gates. The upper gate is the control gate and the bottom gate is a floating gate disposed between the control gate and the substrate. Programming or writing is accomplished by injection of hot electrons from the substrate through an oxide layer in response to a high applied drain voltage Erasure is accomplished by photoemission of hot electrons from the floating gate to the control gate and the substrate.

EEPROMs generally employ two element cells with two transistors Programming and erasure are accomplished by means of the Fowler-Nordheim effect which employs electrons that are tunneled through the energy barrier at the silicon-silicon oxide interface and into the oxide conduction band During a read operation, the state of the EEPROM cell is determined by current sensing by use of a select transistor.

The conventional nonvolatile split gate memory cell that has been used in the past required a self-aligned source-drain implant so that the cell area would be able to be reduced in size, to 30 $\mu m^2$ or less for example. Generally, such cells are programmed by channel injection of hot electrons and erased by Fowler-Nordheim tunneling or photoemission from the floating gate. The programming voltage required for operation of a split gate nonvolatile memory cell is much lower than those used for conventional EEPROMs.

The conventional split gate memory cell made by prior art processes includes a floating gate that is charged by injection of hot electrons from the channel disposed between the source and drain regions. A control gate is formed over the floating gate to control the portion of the channel region between the floating gate and the source in order to achieve split gate operation. The split gate structure is characterized by a coupling ratio which is not a fixed value.

In split gate memory devices, the floating gate is made to overlap the drain region so that the write function and programming can be implemented. If there is no overlap, or an actual underlap of the floating gate relative to the drain, write cannot be effectuated with hot electron injection and programming efficiency is reduced. In addition, these devices which employ the split gate configuration have the control gate overlapping the floating gate and extending over the channel to overlap the source region to enable turning on and driving the memory cell. In the conventional split gate process, the source and drain junctions generally were formed prior to the poly gate formation. Such prior art processes did not employ a fully self-aligned implant of the source and drain. Thus, the cell area size was extended and the transistor channel length increased.

In the conventional split gate memory cell, any misalignment of the source relative to the control gate affects the read current uniformity of the operating device. In order to avoid such misalignment, prior art devices have provided an overlap of the control gate to the source. Also, in some devices, the drain is self-aligned relative to the floating gate, but the source region is not self-aligned to the control gate, therefore, the channel length of this type of split gate device is not determinate, which adversely affected current dispersion in the memory cell during operation. In such cases where the total channel length is not a fixed distance, programming will also be adversely affected. If the total length varies, it is difficult to scale the dimensions of the layers, particularly to a short length which is desirable for high programming efficiency and reproducible cell current. If the length dimension is too large, then programming efficiency is not adequate, and the cell read current is reduced to the detriment of device operation. In addition, when an overlap is provided between the second polysilicon layer and the source, a substantial area is wasted and cell size becomes unnecessarily larger. Attempts to reduce the geometry and area size of split gate memory cells have met with difficulty due to limitations in the manufacturing process.

One prior art attempt to overcome the difficulties of misalignment of the source region to control gate and drain region to floating gate/control gate edges is described in an article entitled "A 128K Flash EEPROM Using Double-Polysilicon Technology", by Gheorghe Samachisa et al., which appeared in the IEEE Journal of Solid-State Circuits, Vol. SC-22, No. 5, October 1987, pp. 676-683. In this article a structure is disclosed which illustrates self-aligned edges of the floating gate and control gate over the drain region and a self-aligned edge of the control gate over source region, however the process for producing such alignment is not disclosed. In addition, our process produces a device which avoids the disadvantages which are illustrated in FIG. 1(b) in the above-identified immediately preceding article, namely the pitting of the source region during the self-aligned etch, which results in poor surface topography. An abstract of the above-identified Samachisa et al. article appeared in the 1987 IEEE Solid-State Circuits Conference Digest of Technical Papers, Feb. 25, 1987, pp. 76 and 77, however it did not disclose our new process.

SUMMARY OF THE INVENTION

An object of this invention is to provide a process for making a nonvolatile memory cell having a relatively small area and a reduced predetermined channel length.

Another object of this invention is to provide a process for making a split gate transistor which protects the source region from pitting during the self-aligned etch with self-aligned etch at drain side only.

Another object of the invention is to provide a process for producing a nonvolatile memory cell that ensures a consistent predetermined overlap between the floating gate and the drain region, and the control gate and the source region.

In accordance with this invention, we provide a process for producing a high density split gate nonvolatile memory cell which has a control gate and a floating gate, wherein the control gate is formed over a portion of the floating gate and extends to overlap a portion of the source region. The control gate has one side etched over the drain region and the other side etched over the source region. The split gate is etched and self-aligned relative to the drain region. During the etching of the split gate, the source region is protected by an etch mask. The source and drain regions are then implanted. The effective channel length of the memory cell is fixed so that programming efficiency is improved and read current is maintained uniformly. In addition, the area of the memory cell is effectively minimized by virtue of the configuration of the device.

DESCRIPTION OF THE DRAWINGS

The invention will be described in detail with reference to the drawing in which:

FIG. 1 is a representational top view, partly broken away, of a section of a two cell memory device, made in accordance with this invention; and FIGS. 2a-g depict the steps of the process for making a nonvolatile memory device of this invention.

DETAILED DESCRIPTION OF THE INVENTION

FIG. 1 represents a self-aligned etch mask 22 for defining the floating gate 12 edge over the drain and aligning the edge of control gate 16 thereabove.

Figure 2C:
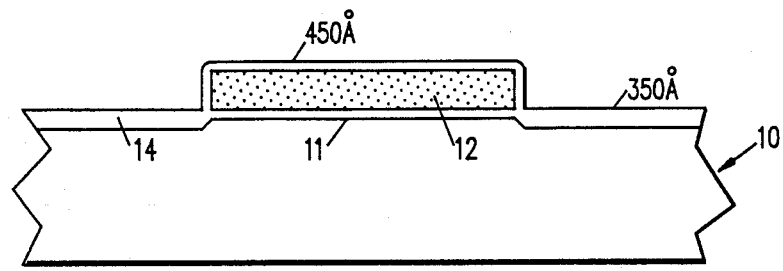

With reference to FIG. 2a, a high density split gate EEPROM memory cell structure comprises a polysilicon crystalline substrate 10 in which a P-type impurity, such as boron, has been implanted. An oxide layer 11 of about 150Å–200Å is thermally grown on the surface of the substrate 10. A layer of polysilicon 12 is deposited over the oxide to a thickness of about 3000Å, and patterned to define a floating gate as shown in FIG. 2b. The thin 150Å–200Å oxide layer 11 surrounding the floating gate is then stripped and a relatively thick gate oxide 14 is thermally grown over the floating gate 12, as illustrated in FIG. 2c.

Figure 2D:
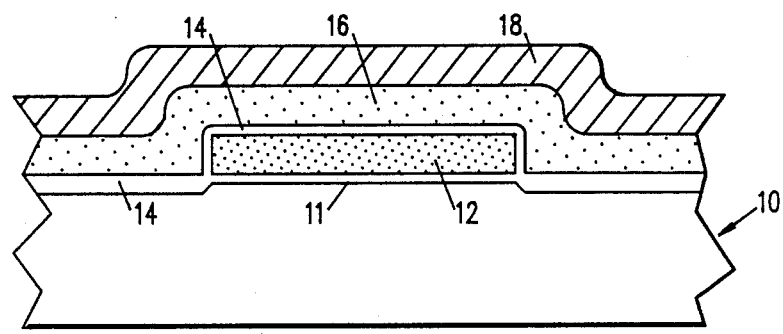
Figure 2E:
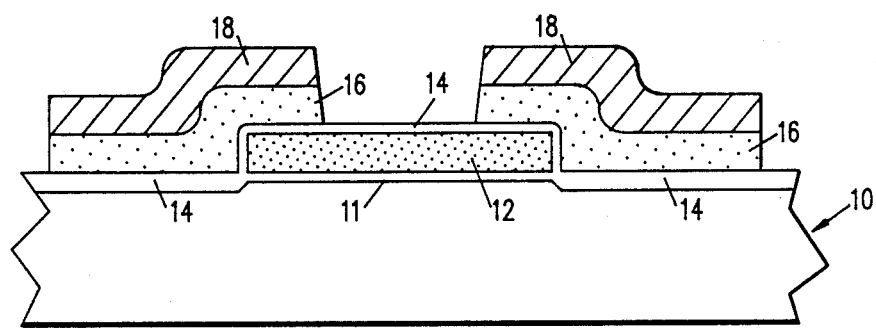
Figure 2F:
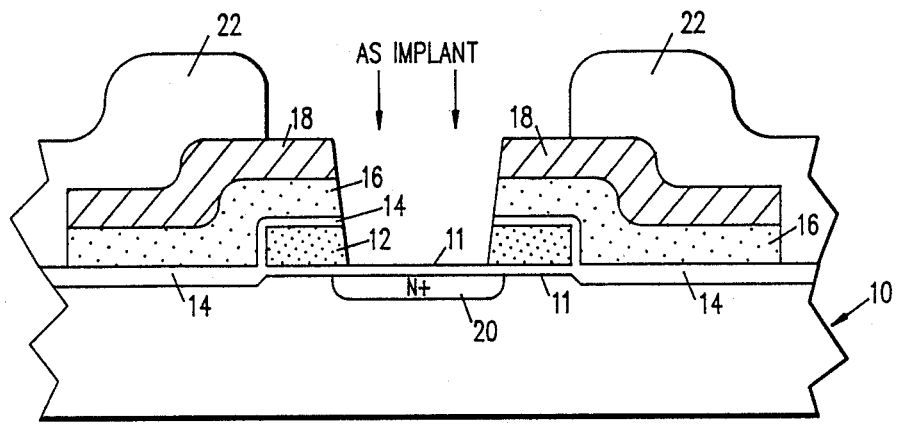

As shown in FIG. 2d, following the growth of the gate oxide 14, a second polysilicon layer 16 is deposited to a thickness of about 4000Å. A masking material 18 of silicon oxide or a photoresist, having a defined pattern, is deposited over the second polysilicon layer 16. As illustrated in FIG. 2e, the control gate is etched from the polysilicon 16 down to the gate oxide 14. The control gate has one etched side over the drain region, the other etched side over the source region. As shown in FIG. 2f, a self-aligning etch mask 22, which may be made of a photoresist for example is deposited over a portion of the control gate 16 which will serve to protect the source region from an etching agent which is to; be used for self-alignment of the control gate and floating gate. In accordance with this invention, a self-aligned etch step is implemented to etch the structure down to the oxide 11 at the surface of the substrate 10, thereby providing a self-alignment of the floating gate 12 and control gate 16 over a portion of the drain region 20. It will be noted that since etch mask 22 extends over the to be established source region during the foregoing etch, the source region is protected from silicon pitting The drain and source regions are spaced by the channel 28. As illustrated in FIG. 2f, the drain region 20 is implanted with an N-type impurity, such as arsenic or phosphorus.

Figure 2G:
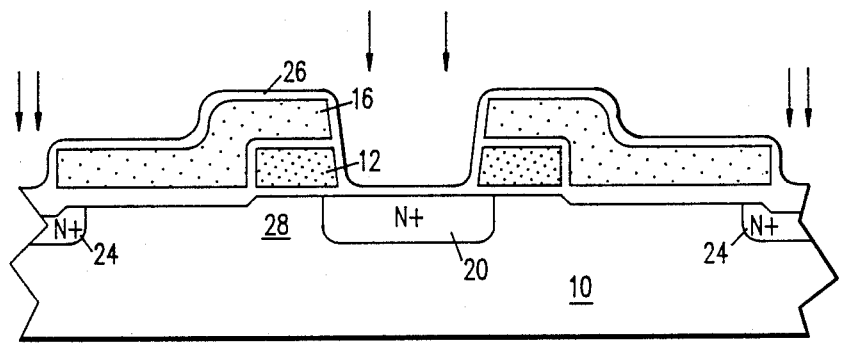

The photoresist etch mask 22 is then stripped, which is first followed by a high temperature drive-in cycle, for example, at a temperature of approximately 1000° C. Next, a second implant of an N+ impurity in the source/drain region 24 and drain region 20, is accomplished as illustrated in FIG. 2g. The first N-type drain implant step provides a deeper drain at the surface of the substrate 10 than the source region, so that the use of a high erase voltage at drain side is made possible for enhanced eraseability. The resulting deeper N+ drain diffusion enhances erase efficiency by providing sufficient floating gate-drain overlap. The transistor device is completed by using standard CMOS processes and providing a passivation layer 26, and metallization and electrodes that allow conduction of signals to and from external circuitry.

There has been disclosed herein a high density split gate nonvolatile memory cell and a process for making such cell which employs conventional etching steps to fully self-align the control gate and floating gate relative to both the source and drain regions. The implantation of impurities at the source and drain regions occurs after the self-alignment etching of the floating gate and control gate. As a result, the memory cell can be made smaller since the channel length can be controlled. Thus, the nonvolatile memory cell can be made with a smaller size area, and is characterized by enhanced programming efficiency and the ease of controlling read current uniformity. The programming of the nonvolatile memory cell uses standard EPROM programming and erasure is accomplished by Fowler-Nordheim tunneling or photoemission. By virtue of self-aligned etching of the split gate at the drain side, a self-aligned implant of the drain region may be performed. Also, the self-alignment of the source region 24 to control gate 16 is achieved as illustrated in FIG. 2g. The effective channel length of the memory cell transistor is approximately 1.0 microns. The channel length is controlled precisely relative to the self-aligned control gate, which is simpler and more expedient than with the prior art approach.

The process disclosed herein requires only a relatively small number of masks to provide a split gate structure wherein the floating gate and control gate are etched and self-aligned respectively at the drain and source sides of each transistor of the memory cell.

What is claimed is:

1. A process for making a high density split gate EEPROM cell having source and drain regions spaced by a channel, comprising the steps of:

providing a semiconductor body;
   implanting a P-type impurity in said body;
   growing a thin oxide layer over said body;
   depositing and defining a first layer of polysilicon over said thin oxide layer;
   growing a second gate oxide layer over said first layer of polysilicon and a portion of said body;
   depositing a second layer of polysilicon over said second gate oxide layer;
   masking with a first mask and etching said second layer of polysilicon to define a control gate having a first edge positioned above said first layer of polysilicon and a second edge positioned on said second gate oxide above said body;
   providing a second mask covering the area of said body below which the source region will be formed and covering at least a portion of said first mask such that the surface of said body where said source region will be formed will be protected during an etching process;

etching said first layer of polysilicon to define a floating gate with one edge self-aligned with said first edge of said control gate;

implanting N-type impurities in said drain region which is self-aligned to said floating gate and said control gate to form an N-type conductivity region;

removing said first and second mask; and implanting N-type impurities in said source region which is self-aligned to said control gate and into the drain region.

2. A process as in claim 1, wherein said masking is accomplished with a silicon oxide or photoresist mask.

3. A process as in claims 1 or 2, including the step of providing a drive-in cycle for the impurities implanted in said drain region before the step of implanting impurities in said source region.

* * * * *